United States Patent
Park et al.

(10) Patent No.: US 6,909,620 B2
(45) Date of Patent: Jun. 21, 2005

(54) INVERTER CONFIGURATIONS WITH SHOOT-THROUGH IMMUNITY

(75) Inventors: Shihong Park, Madison, WI (US); Thomas M. Jahns, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 66 days.

(21) Appl. No.: 10/423,818

(22) Filed: Apr. 25, 2003

(65) Prior Publication Data

US 2004/0213026 A1 Oct. 28, 2004

(51) Int. Cl.$^7$ ............................................ H02H 7/122
(52) U.S. Cl. ................................................ 363/56.04
(58) Field of Search ........................ 363/55, 56.01, 363/56.02, 56.03, 56.04, 98, 132

(56) References Cited

U.S. PATENT DOCUMENTS

| | | | | |
|---|---|---|---|---|
| 3,976,932 | A | * 8/1976 | Collins | 363/132 |
| 4,126,819 | A | 11/1978 | Stobbe et al. | 363/132 |
| 4,566,059 | A | * 1/1986 | Gallios et al. | 363/17 |
| 5,469,095 | A | 11/1995 | Peppiette et al. | 327/110 |
| 5,646,837 | A | 7/1997 | Weggel | 363/124 |
| 5,859,519 | A | 1/1999 | Archer | 363/132 |
| 5,933,341 | A | * 8/1999 | Kuriyama et al. | 363/98 |
| 6,307,409 | B1 | 10/2001 | Wrathall | 327/112 |
| 2001/0048278 | A1 | 12/2001 | Young et al. | 318/254 |

OTHER PUBLICATIONS

Takashi Sukegawa, et al., "Fully Digital, Vector–Controlled PWM VSI–Fed ac Drives with an Inverter Dead–Time Compensation Strategy," IEEE Trans. on Ind. Applications, vol. 27, No. 3, May/Jun. 1991, pp. 552–559.

Kiyoaki Sasagawa, et al., "A New Driving and Protective Circuit of IGBT for Motor Drive Application," Proc. Of 1993 IEEE Appl. Power Elec. Conf. (APEC), Dec. 1993, pp. 402–407.

D.R.H. Carter, et al., "Electronic Level Shifter for Use in Half–Bridges Operating at 13.56 MHz," Electronics Letters, vol. 31, No. 16, 3$^{rd}$ Aug. 1995, pp. 1301–1302.

Jong–Woo Choi, et al., "A New Compensation Strategy Reducing Voltage/Current Distortion in PWM VSI Systems Operating with Low Output Voltages," IEEE Trans. on Industry Applications, vol. 31, No. 5, Sep./Oct. 1995, pp. 1001–1008.

Jong–Woo Choi, et al., "Inverter Output Voltage Synthesis Using Novel Dead Time Compensation," IEEE Trans. on Power Electronics, vol. 11, No. 2, Mar., 1996, pp. 221–227.

(Continued)

*Primary Examiner*—Jeffrey Sterrett
(74) *Attorney, Agent, or Firm*—Foley & Lardner LLP (57) ABSTRACT

An inverter phase leg with shoot-through protection that may be used in inverters includes a high side semiconductor switch and a low side semiconductor switch which are connected across DC supply lines and which have an output node between them. A series diode or connector switch is connected between the output node and the low side switch, and the junction between the diode or connector switch and the low side switch is electrically connected directly to the gate of the high side switch. If the low side switch is still conducting at the time that the high side switch receives a command to turn on, the gate of the high side switch will be biased so that the switch is held off until current stops flowing through the low side switch and, conversely, if the high side switch is still on at the time that the low side switch is turned on, the gate of the high side switch will be biased to insure its immediate turn-off, thereby preventing a shoot-through condition under which the high side and low side switches are turned on at the same time.

25 Claims, 5 Drawing Sheets

OTHER PUBLICATIONS

David Leggate, et al., "Pulse–Based Dead–Time Compensator for PWM Voltage Inverters," IEEE Trans. on Industrial Electronics, vol. 44, No. 2, Apr. 1997, pp. 191–197.

Alfredo R. Munoz, et al., "On–Line Dead–Time Compensation Technique for Open–Loop PWM–VSI Drives," IEEE Trans. on Power Electronics, vol. 14, No. 4, Jul. 1999, pp. 683–389.

G.F.W. Khoo, et al., "Analysis of a Charge Pump Supply with a Floating Voltage Reference," IEEE Trans. on Circuits and Systems–I: Fundamental Theory and Applications, vol. 47, No. 10, Oct. , 2000, pp. 1494–1501.

S. Musumeci, et al., "A New Gate Circuit Performing Fault Protections of IGBTs During Short Circuit Transients, " Rec. of the 2002 IEEE Ind. Appl. Society Ann. Meeting, Oct. 2002, vol. 4, pp. 2614–2621.

* cited by examiner

INVERTER CONFIGURATIONS WITH SHOOT-THROUGH IMMUNITY

STATEMENT OF GOVERNMENT RIGHTS

This invention was made with United States government support awarded by the following agency: NSF 9731677. The United States government has certain rights in this invention.

FIELD OF THE INVENTION

This invention pertains generally to the field of electrical power conversion and particularly to DC to AC inverters utilizing semiconductor switches.

BACKGROUND OF THE INVENTION

Electrical power inverters typically utilize pairs of semiconductor switches that are connected together across DC bus or supply lines to which a DC voltage source is connected. The switches are alternately turned on and off in a selected switching sequence to provide AC power to a load connected to a node between the two switches. The high side semiconductor switches are almost always selected to be n-type devices because of their superior switching characteristics and low on-resistance compared to p-type devices. As a result, the high side switch requires a floating voltage source and level-shift function that contributes to the cost and complexity of the inverter gate drive. A single pair of semiconductor switches connected in this manner may be used by itself to provide single phase AC power to a load, or two pairs of switches may be connected together in a conventional H-bridge configuration, for single phase power, three pairs of switches for three phase power, and so on. Each pair of switches may be considered a phase leg of a single phase or multiphase inverter.

Because the two switches of the phase leg are connected in series across the DC bus lines, if both of the switches are turned on simultaneously a potentially catastrophic shoot-through condition exists in which short circuit current through the switches could burn out the switches or damage other circuit components. In conventional phase leg configurations, dead time is almost always added to the gate drive signals provided to the switches to ensure that one of the switches is completely turned off before the other switch is turned on. However, the presence of dead time can add a significant amount of undesired non-linearity and harmonic distortion to the pulse width modulated (PWM) output voltage waveforms. Depending on the current direction, the actual phase voltage can gain or lose voltage in comparison to the ideal PWM waveform. The output waveform distortion and the voltage amplitude loss of the fundamental-frequency component become worse as either the fundamental frequency or the carrier frequency increases.

Many different methods for compensating for dead time have been proposed, typically by compensating the effects of dead time indirectly using appropriate control methods to modify the PWM commands. Measured phase current polarity information is often required to carry out these compensation algorithms. The very fast (sub-microsecond) time scale for phase leg switching, combined with practical difficulties associated with zero-crossing detection errors, has made it difficult to satisfactorily achieve dead time compensation under all conditions, and the added complexity of such approaches also increases the total cost of the inverter.

Various circuits have been proposed for preventing shoot-through by effectively sensing current flow through the switches and ensuring the turn-off of a conducting switch before the other is turned on. See U.S. Pat. Nos. 4,126,819, 5,646,837 and 5,859,519 and published U.S. patent application US2001/0048278A1. Such circuits require significant additional components, with significant added cost, or still require delays between turn-off and turn-on of the switches with corresponding dead time in the PWM waveforms.

SUMMARY OF THE INVENTION

In accordance with the invention, shoot-through in the switching devices of the inverter phase legs is prevented without requiring dead time in the command signals provided to the inverter switching devices. The inverter phase leg configurations of the invention provide shoot-through immunity at relatively low cost and complexity, and with high reliability.

In an embodiment of the present invention, each inverter phase leg configuration includes a high side semiconductor switch and a low side semiconductor switch connected across the DC supply lines, an output node connection between the two switches, and a series diode connected between the output node and the low side switch. The junction between the series diode and the low side switch is electrically connected directly by a low resistance conductor to the gate of the high side switch. The high side switch is turned on when a positive bias is applied between its input gate and the output node, and is turned off when a negative bias is applied between the gate and the connection of the high side switch to the output node. If the low side switch is still conducting at the time that the high side switch is turned on, the voltage across the diode will back bias the gate of the high side switch to insure that it is kept off until current stops flowing through the low side switch. Conversely, if the high side switch is still on at the time that the low side switch is turned on, and current begins to flow through the low side switch, the voltage across the series diode will back bias the gate of the high side switch to insure its turn-off. Because of the inherent protection against shoot-through provided by the invention, a simplified driver circuit may be utilized which provides a drive signal to only the low side switch, with the high side switch being provided with constant turn-on voltage through a resistance so that the gate voltage of the high side switch goes positive when and only when the low side switch is turned off. No delays need be provided between turn-on and turn-off of the switches and no circuit provisions are needed to introduce delays.

The inverter phase leg of the present invention may also utilize a separate driving amplifier for the high side switch. The output of the low side driver amplifier is provided via a line through a diode to provide an input voltage to the input of the inverting driver amplifier. The inverted output of the amplifier is provided through the resistor to the gate of the high side switch. This implementation increases the robustness of the gate drive circuit for the high side switch by insuring that the gate terminal of the high side switch is always held to zero volts or less whenever the low side switch is on. During the intervals when the high side switch is on, the presence of the high side driver amplifier helps to speed the turn-on transition of the high side switch. It also minimizes the gate drive losses by reducing the power dissipation in the gate resistor while the low side switch is on.

In a further embodiment of the invention, the gate drive circuits providing the turn-on and turn-off signals to the gates of the switching devices may also provide a turn-on signal to a connector switch, such as a MOSFET, connected between the output node and the low side switch, which is provided with a gate control signal to turn on at the same time as the low side switch. The junction between the connector switch and the low side switch is connected by a conductor to the gate of the high side switch. When the connector switch is on, it effectively drives the voltage on the gate of the high side switch to zero, ensuring its turn-off. The connector switch can be selected to have a very low resistance in its on-state to minimize power loss and output waveform distortion and can be implemented as a power MOSFET synchronous rectifier having a parallel diode and switch in a unitary device. This device has the advantage that even if the switch fails because its gating signal is removed, the parallel diode will function as discussed above to prevent shoot-through, but with some additional loss.

Two of the phase legs in accordance with the invention may be connected together in a conventional H-bridge configuration, with the high and low side switches in the two phase legs alternatively turning on and off to provide AC power across a load. The invention may also be implemented in a three or higher phase implementation utilizing three or more of the phase legs under appropriate control to provide a polyphase output across the load.

Further objects, features and advantages of the invention will be apparent from the following detailed description when taken in conjunction with the accompanying drawings.

DETAILED DESCRIPTION OF THE INVENTION

Figure 1:
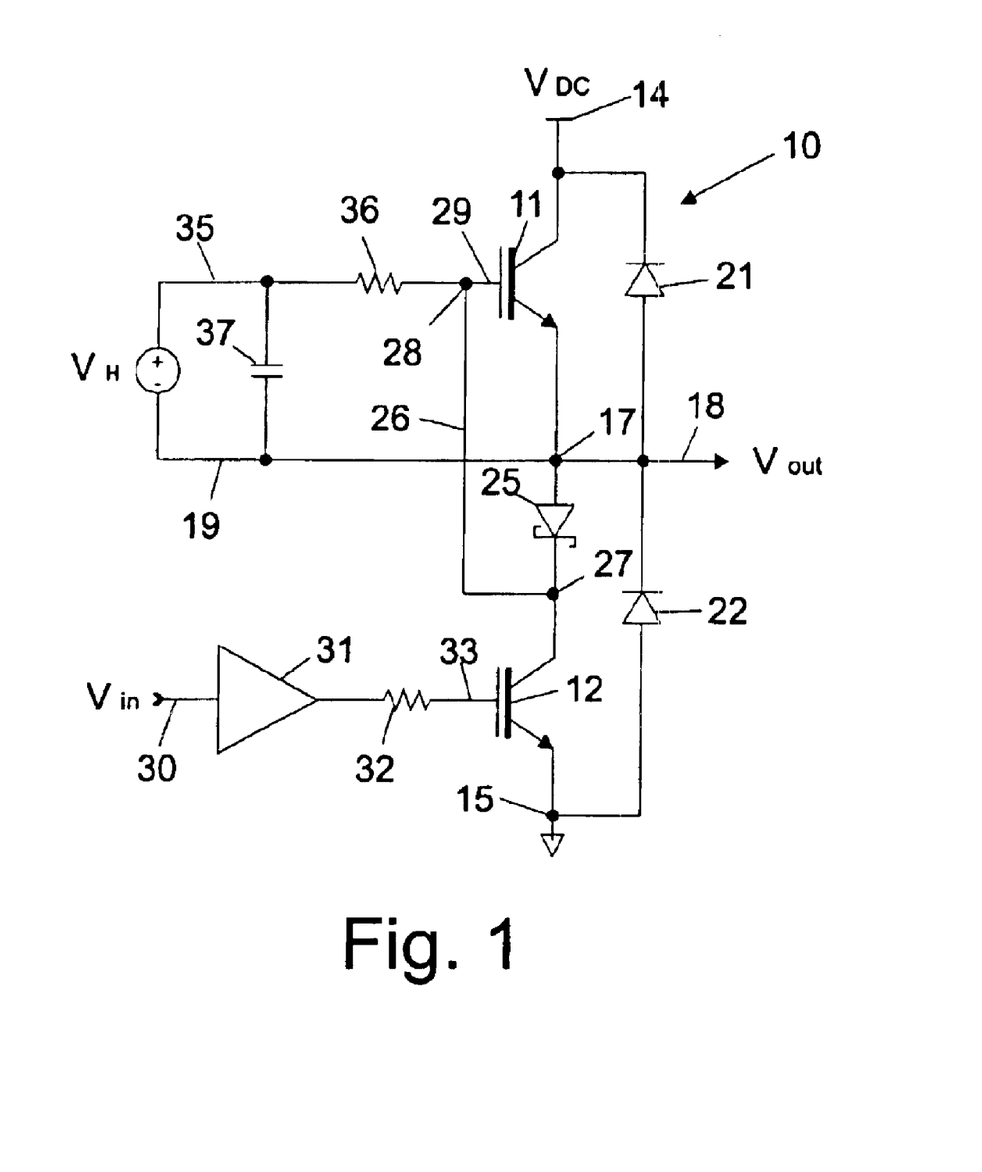
FIG. 1 is a schematic circuit diagram of an inverter phase leg in accordance with the present invention.

With reference to the drawings, a basic implementation of an inverter phase leg configuration in accordance with the invention is shown generally at 10 in FIG. 1. The phase leg configuration 10 of FIG. 1 includes a high side gate controlled semiconductor switch 11 and a low side gate controlled semiconductor switch 12 which are connected in series across DC supply lines 14 and 15, which may be DC bus lines supplied with power from a DC power supply (not shown) that is providing an appropriate DC output voltage across the lines 14 and 15. As illustrated in FIG. 1, the line 15 may be the common or ground line. The switching devices 11 and 12 may be, for example only, insulated gate bipolar transistors (IGBTs), as illustrated in FIG. 1, or power MOSFETs, bipolar transistors, etc. An output node 17 between the switches 11 and 12 is connected to an output line 18 on which the AC output voltage of the inverter is provided. The output line 18 is also connected to a common line 19 for the floating voltage source voltage $V_H$ that provides gate drive power for the high side switch 11 as shown in FIG. 1. As is conventional in inverters of this type, a high side flyback diode 21 is connected in parallel with the high side switch 11 between the output node 17 and the high level supply line 14, and a flyback diode 22 is connected in parallel with the low side switch 12 between the low line 15 and output node 17. In accordance with the invention, a series diode 25 is connected between the output node 17 and the low side switch 12, and is oriented to conduct current from the output node 17 to the low side switch 12 and to block current in the opposite direction. An electrical conducting line 26 is connected from a junction 27 between the diode 25 and the switch 12 to a connection 28 at the gate input 29 of the gate controlled high level switch 11. The diode 25 may be a low-voltage Schottky diode to minimize conduction losses. The conducting line 26 provides a direct electrical connection between the junction 27 and the gate input 29 without a resistive component such as a resistor and with very low residual resistance (preferably less than one ohm and most preferably as close to zero as practically possible). Such conditions provide shoot through protection without requiring delays between turn on and turn off of the inverter switches.

In the phase leg configuration 10 of FIG. 1, a gate drive signal is provided only to the low side switch 12. The gate drive control signal $V_{in}$ is provided on a line 30 to a gate driver amplifier 31 which provides its output voltage signal through a resistor 32 to the gate 33 of the low side switch 12. To provide gating to the high side switch 11, a constant high side gate voltage $V_H$ is provided on a line 35 (referenced to the common line 19) through a resistor 36 to the gate 29 of the high side switch 11. A capacitor 37 can be connected between the line 35 and the common line 19 to help stiffen the voltage supply for the high side switch gate drive.

The operation of the circuit of FIG. 1 can be explained as follows. When the input command signal $V_{in}$ is high, the low side switch 12 turns on because of the buffering action of the low side driver amplifier 31. The gate-to-emitter voltage (for an IGBT, or gate-to-source voltage for a MOSFET switch) of the high side switch 11 becomes either one-diode voltage drop negatively biased or one-diode voltage drop positively biased, depending on the direction of the phase leg output current. In either case, the gate-emitter voltage for the high side switch 11 is below its threshold voltage and it remains in its off-state. When $V_{in}$ changes to low, so that the low side switch 12 turns off, the high side switch 11 starts to turn on because the low side switch 12 no longer draws current through the series diode 25. The high side capacitor 37 can now deliver charge to the gate 29 of the high side switch 11 through the resistor 36. Therefore, the series diode 25 becomes reverse biased as charge on the capacitor 37 is transferred to the gate capacitor of the switch 11. The voltage across the diode 25 rises above the gate threshold voltage and the high side switch 11 turns on.

When the input command signal $V_{in}$ again goes high, the low side switch 12 is turned on, which discharges the gate of the high side switch 11, causing it to turn off.

The presence of the series diode 25 and the direct electrical connection 26 to the gate 29 of the high side switch 11 makes it impossible for a short-circuit condition to develop in which current flows simultaneously through both the high side switch 11 and the low side switch 12, because it is impossible for the diode junction of the diode 25 and the gate-emitter terminals of the high side switch 11 to be simultaneously forward biased. If current is flowing through the series diode 25, the voltage drop across it negatively biases the gate to emitter junction of the high side switch 11, thereby insuring that the switch either turns off or remains off. Because the line 26 is a very low resistance conductor, the high side switch will turn off immediately when the low side switch turns on, simultaneously avoiding shoot-through and eliminating the need for any delay time that must be added by the circuit.

Figure 2:
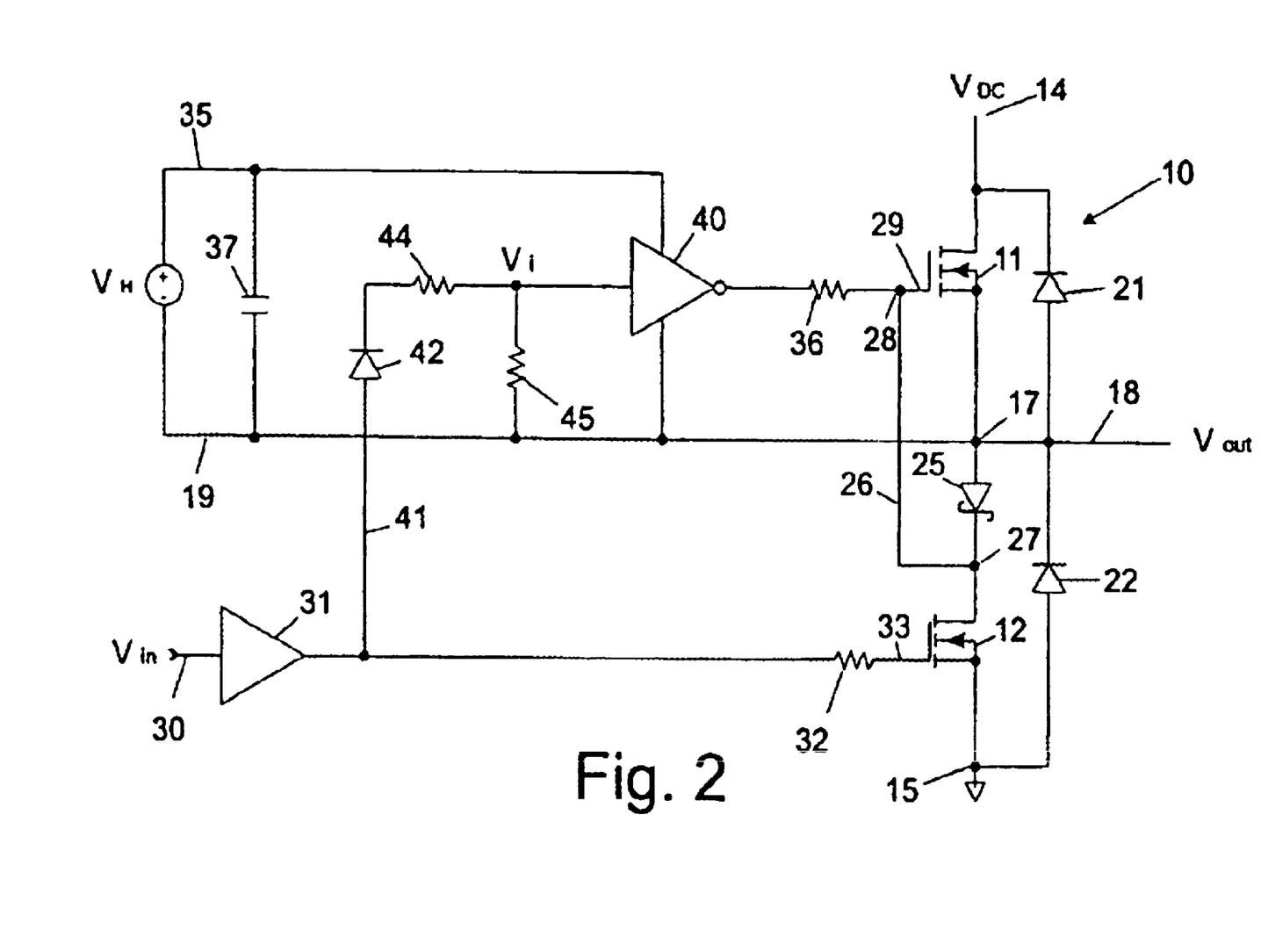
FIG. 2 is a schematic circuit diagram of another implementation of the inverter phase leg of the invention.

FIG. 2 illustrates the inverter phase leg of the present invention utilizing a separate driving amplifier 40 for the high side switch. The output of the low side driver amplifier 31 is provided via a line 41 through a diode 42 and a voltage divider formed by resistors 44 and 45, to provide an input voltage $V_2$ to the input of the inverting driver amplifier 40. The amplifier 40 is connected across the high side gate drive voltage line 35 and the common line 19. The inverted output of the amplifier 40 is provided through the resistor 36 to the gate 29 of the high side switch 11. Although the implementation of FIG. 2 provides the same output in response to the input voltage $V_{in}$ as the inverter circuit of FIG. 1, it increases the robustness of the gate drive circuit for the high side switch 11 by insuring that the gate terminal 29 of the high side switch is always held to zero volts or less whenever the low side switch is on. When the output voltage $V_{out}$ on the output line 18 is pulled low, the input voltage $V_1$ at the input to the amplifier 40 transitions high. Since the driver amplifier 40 provides an inverting function, its output switches low, thus ensuring that the high side switch 11 is held firmly off whenever the low side switch 12 is on. In particular, the presence of the driver amplifier 40 insures that the gate-emitter voltage for the high side switch 11 is held to zero volts or less regardless of whether the output current is flowing through the low side switch 12 or the diode 22. In contrast, the gate-emitter voltage of the high side switch 11 rises to at least a diode-voltage-drop above zero when the current is flowing through the diode 22 in the circuit of FIG. 1. This voltage will still be below the threshold voltage of the high side switch 11, so that it will not be able to turn on, but the presence of the driver amplifier 40 in the circuit of FIG. 2 provides additional robustness.

During the intervals when the high side switch 11 is on, the presence of the high side driver amplifier 40 helps to speed the turn-on transition of the high side switch and minimizes the gate drive losses by reducing the power dissipation in the gate resistor 36 as compared to the circuit of FIG. 1.

Figure 3:
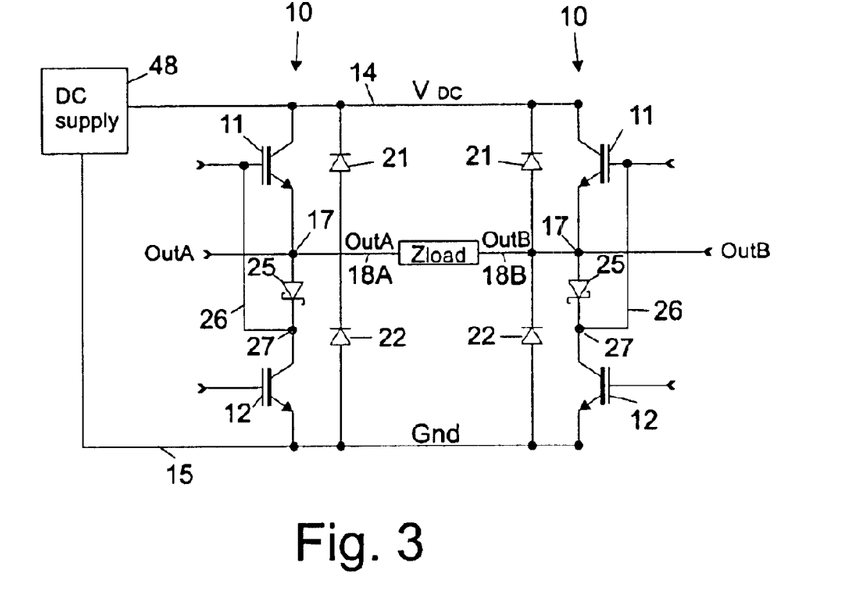
FIG. 3 is a schematic circuit diagram of an H-bridge inverter output stage utilizing the inverter phase leg configurations of the invention.
Figure 4:
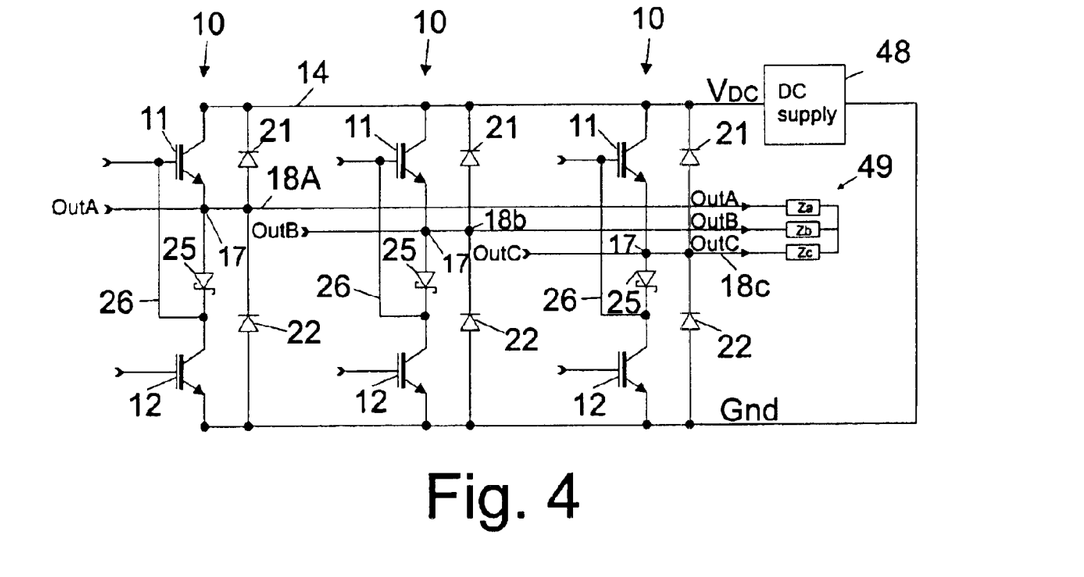
FIG. 4 is a schematic circuit diagram of a three-phase inverter output stage using the inverter phase leg configurations of the invention.

The inverter phase leg 10 can be utilized by itself in appropriate applications or can be incorporated as a phase leg in inverter bridge circuits. FIG. 3 illustrates the incorporation of two inverter phase legs 10 in accordance with the invention in an H-bridge circuit in which the two inverter phase legs 10 have output lines designated 18A and 18B which are connected to a load 47, but which are otherwise identical to the phase legs 10 shown in FIGS. 1 or 2. DC power is provided across the supply lines 14 and 15 by a DC power supply 48. As in conventional H-bridge circuits, the high side switch 11 of each inverter phase leg 10 is turned on in tandem with the low side switch 12 of the other inverter phase leg to provide alternating direction current flow through the load 47. The inverter may also be controlled so that at times both high side switches or both low side switches are on simultaneously. The bridge configuration may be extended to polyphase circuits, as in the three-phase circuit illustrated in FIG. 4 in which three inverter phase legs 10 are connected across the DC supply lines 14 and 15, which are connected to a DC power supply 48. The output lines of the three inverter phase legs, designated 18A, 18B and 18C in FIG. 4, are connected to the input of the three-phase load schematically represented at 49 in FIG. 4. The switches of each phase leg may be operated in a conventional three-phase switching bridge scheme to provide the appropriate phase voltages across the three-phase load 49. Each of the pairs of switches in each phase leg 10 is provided with a driver circuit (not shown in FIGS. 3 and 4), examples of which are shown in FIGS. 1 or 2 as discussed above, or in FIGS. 5 and 6 as discussed below.

Figure 5:
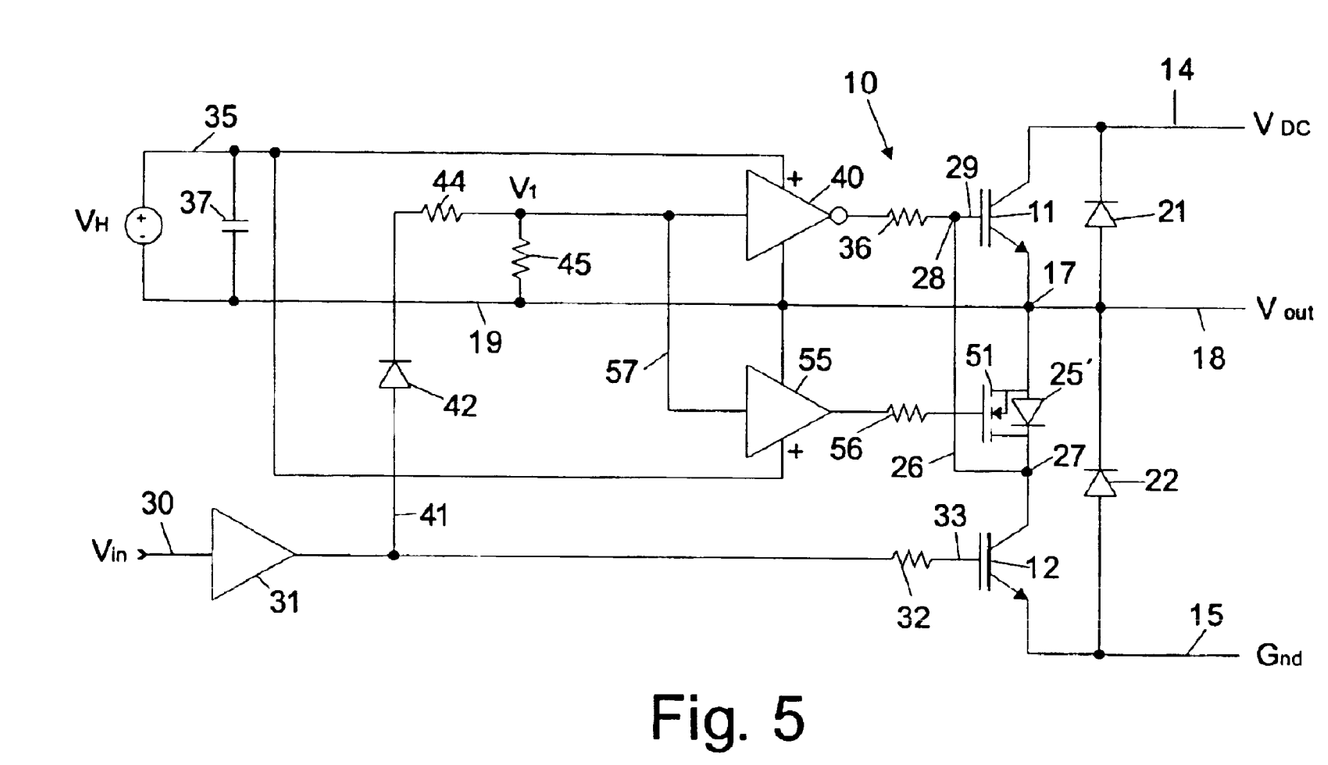
FIG. 5 is a further implementation of the inverter phase leg of the present invention incorporating a connector switch.
Figure 6:
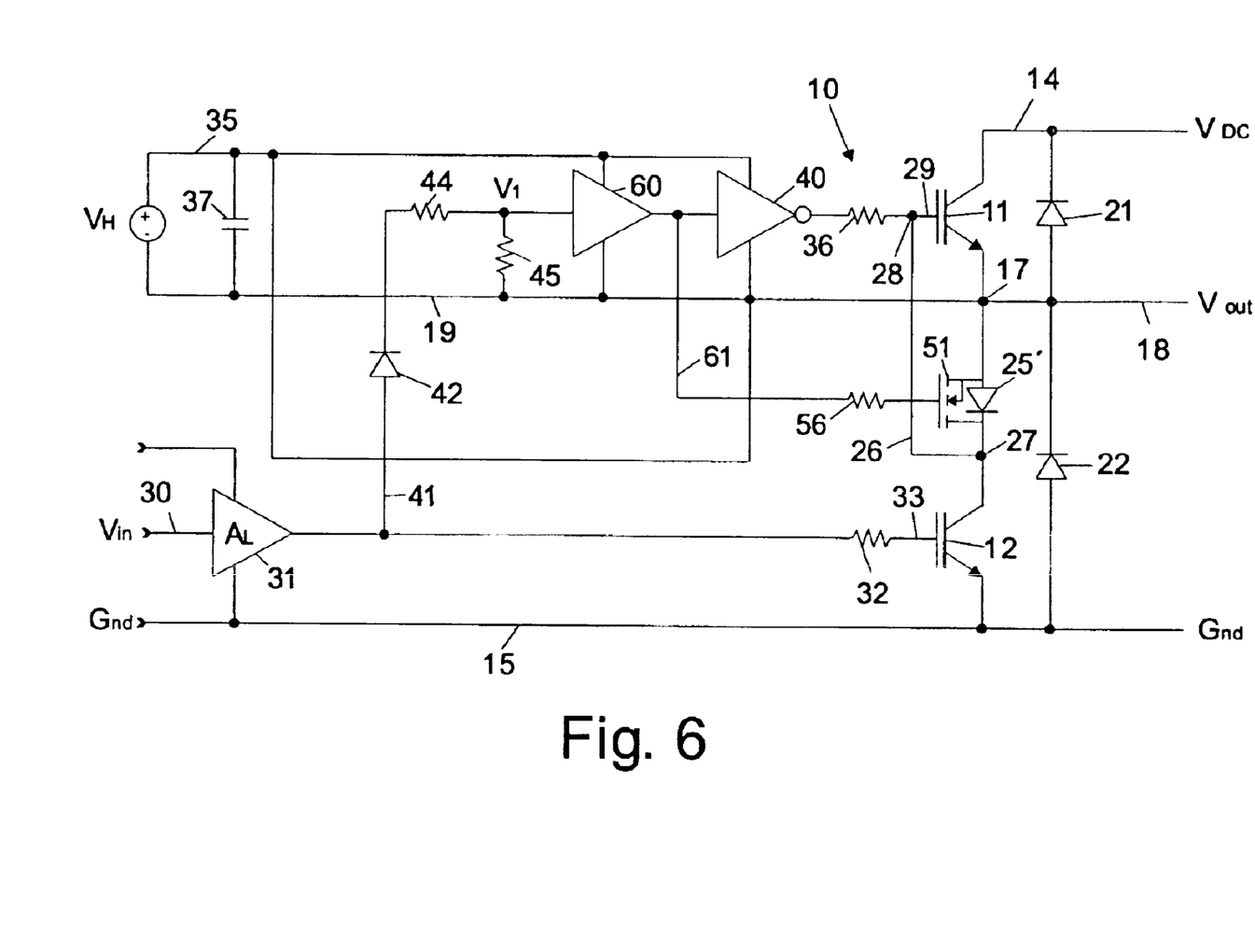
FIG. 6 is a schematic circuit diagram of another implementation of the inverter phase leg configuration of FIG. 5.

FIG. 5 illustrates another implementation of the inverter phase leg in accordance with the invention utilizing a connector switch 51 such as a synchronous rectifier MOSFET connected in series with the switches 11 and 12 and between the output node 17 and the low side switch 12. The utilization of the connector switch 51 rather than the series diode 25 reduces the forward voltage drop across the component, thereby reducing the phase leg losses. A synchronous rectifier is a three terminal active device that is gated to behave as a two terminal diode device, except that the presence of the low-impedance conducting channel of the device reduces its forward voltage drop considerably compared to a conventional PiN diode or even a Schottky diode. The connector switch 51 may comprise a power MOSFET that has a body diode 25' that functions effectively as the series diode 25 with an active MOSFET bypass switch connected in parallel therewith. The MOSFET 51 as shown in FIGS. 5 and 6 is connected with its source connected to the output node 17 and its drain connected to the junction 27 so that when it turns on it conducts in parallel with and effectively bypasses the body diode 25'. The maximum reverse voltage across the diode 25 of FIGS. 1 and 2 or the synchronous rectifier 51 is limited by the high side switch gate-drive voltage $V_H$ to, e.g., about 20 V, so that it is possible to use low voltage rated components, even through the bus voltage across the lines 14 and 15 may be quite high (e.g., greater than 300 volts). Since the connector switch 51 is a three terminal device, it requires a drive circuit that shares the same floating voltage source as the high side gate drive. As illustrated in FIG. 5, this drive may be provided by a drive amplifier 55 which receives its input on a line 57 from the input to the inverting amplifier 40, and is connected to receive power from the gate drive voltage line 35 and to the common line 19. The output of the driver amplifier 55 is provided through a resistor 56 to the gate of the synchronous rectifier connector switch 51. Because the amplifier 40 is inverting, and the amplifier 55 is non-inverting, the gate input to the connector switch 51 is the complement to the gate input to the high side switch 11, so that the synchronous rectifier connector switch 51 is on only when the gate input to the high side switch 11 is off. The body diode 25' that is incorporated as part of a power MOSFET switch 51 insures that there is always a legal current path through the device even before it fully turns on. However, the forward drop across the connector switch 51 will be much smaller when the MOSFET channel is fully conducting compared to when it is off, so that the losses are minimized when the device is turned on. The presence of the body diode 25' insures that the phase leg will be able to continue operating with shoot-through protection even if the MOSFET portion of the synchronous rectifier switch 51 does not turn on (due to, for example, failure in the amplifier 55), which would increase the phase leg losses but still allow operation to continue. The advantage of utilizing a synchronous rectifier rather than a series diode are reduced phase leg power dissipation and less of an effect on the output voltage waveforms when the low side switch 12 is conducting. These advantages make the implementation of FIG. 5 particularly suited to high-current low-voltage applications. The synchronous rectifier MOSFET 51 with body diode 25' effectively functions as a diode and parallel connected semiconductor bypass switch, and can be implemented with separate devices, e.g., a Schottky diode and a parallel connected MOSFET. The utilization of a synchronous rectifier device has the advantage of incorporating both components in a single device with a potential savings in cost and size, as well as minimizing the voltage drop across the conducting channel of the MOSFET. The connecting switch 51 may also be implemented as a semiconductor switch without an intrinsic diode or as parallel discrete components, e.g., an IGBT and a diode connected in parallel.

Another implementation of the drive circuit for the phase leg 10 is shown in FIG. 6. The circuit of FIG. 6 is similar to that of FIG. 5 except that instead of having a parallel driver amplifier 55 for the synchronous rectifier connector switch 51, a series connected amplifier 60 is connected to receive the voltage $V_1$ across the voltage divider formed by the resistors 44 and 45, and is connected to receive power across the gate voltage supply line 35 and the common line 19. The output of the amplifier 60 is provided to the input of the inverting amplifier 40 and is also provided on a line 61 through the gate resistor 56 to the gate of the synchronous rectifier 51.

It is understood that the invention is not confined to the particular embodiments set forth herein as illustrative, but embraces all such forms thereof as come within the scope of the following claims.

What is claimed is:

1. A DC to AC inverter comprising:
   (a) a high DC supply line and a low DC supply line; and
   (b) two or more inverter phase legs connected across the high supply line and the low supply line, each inverter phase leg comprising:
      (1) a high side gate controlled switch connected to the high line and a low side gate controlled switch connected to the low line, the switches connected between the high line and the low line with an output node between the high side switch and the low side switch;
      (2) a gate controlled connector switch connected between the output node and the low side switch; and
      (3) an electrical conductor providing a direct electrical connection without a resistive component from a junction between the connector switch and the low side switch to the gate of the high side switch.

2. The inverter of claim 1 wherein for each phase leg the high side switch and the low side switch each comprise an IGBT, and including a flyback diode connected in parallel with the high side switch from the high supply line to the output node and a flyback diode connected in parallel with the low side switch from the output node to the low supply line.

3. The inverter of claim 1 wherein for each phase leg the high side switch and the low side switch each comprise a power MOSFET.

4. The inverter of claim 1 further including for each phase leg a low side driver amplifier having an input that can receive a gate control signal and an output connected to the gate of the low side switch, and a high side inverting driver amplifier having an output connected through a resistance to the gate of the high side switch, the output of the low side driver amplifier connected to an input of the high side inverting amplifier, the high side inverting amplifier connected between a high side gate voltage supply line and a line connected to the output node and providing at its output either the high side gate voltage or the voltage at the output node, the connector switch connected to turn on when the high side switch turns off.

5. The inverter of claim 4 further including for each phase leg a connector switch driver amplifier having an output connected to the gate of the connector switch and an input connected to the input of the high side driver amplifier so that the connector switch driver amplifier provides an output signal to turn on the connector switch when a signal is provided to the high side inverting amplifier to turn off the high side switch.

6. The inverter of claim 4 further including for each phase leg a connector switch driver amplifier connected to receive the output of the low side driver amplifier as its input and having an output connected to the input of the high side driver amplifier, the connector switch driver amplifier providing a non-inverting output that is electrically connected to the gate of the connector switch so that the connector switch is turned on when a signal is provided to turn off the high side switch and is turned off when a signal is provided to turn on the high side switch.

7. The inverter of claim 1 wherein for each phase leg the connector switch comprises a unitary synchronous rectifier device having a switch and a parallel diode.

8. The inverter of claim 1 wherein there are two phase legs which are connected together in an H-bridge configuration to provide single phase AC power across a load connected between the two output nodes of the two inverter phase legs.

9. The inverter of claim 1 wherein there are three phase legs connected in a bridge configuration having three output nodes which are connected to provide three phase AC power to a three phase load.

10. An inverter phase leg comprising:
    (a) a high supply line and a low supply line across which a DC voltage may be provided;
    (b) a high side gate controlled switch connected to the high line and a low side gate controlled switch connected to the low line, the switches connected between the high line and the low line with an output node between the high side switch and the low side switch;
    (c) a series diode connected between the output node and the low side switch that is oriented to a conduct current from the output node through the low side switch and to block current in the opposite direction;
    (d) an electrical conductor providing a direct electrical connection without a resistive component from a junction between the series diode and the low side switch to the gate of the high side switch; and
    (e) wherein a gate signal can be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including a semiconductor switch connected in parallel with the series diode and having a gate input by which the semiconductor switch may be turned on and off, and including a switch driver amplifier having an output connected to the gate of the semiconductor switch and an input connected to the input of the high side driver amplifier so that the switch driver amplifier provides an output signal to turn on the semiconductor switch when a signal is provided to the high side inverting amplifier to turn off the high side switch.

11. An inverter phase leg comprising:

(a) a high supply line and a low supply line across which a DC voltage may be provided;

(b) a high side gate controlled switch connected to the high line and a low side gate controlled switch connected to the low line, the switches connected between the high line and the low line with an output node between the high side switch and the low side switch;

(c) a series diode connected between the output node and the low side switch that is oriented to a conduct current from the output node through the low side switch and to block current in the opposite direction;

(d) an electrical conductor providing a direct electrical connection without a resistive component from a junction between the series diode and the low side switch to the gate of the high side switch; and (e) wherein a gate signal can be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including a semiconductor switch connected in parallel with the series diode and having a gate input by which the semiconductor switch may be turned on and off, and including a switch driver amplifier having an output connected to the gate of the semiconductor switch and an input connected to the input of the high side driver amplifier so that the switch driver amplifier provides an output signal to turn on the semiconductor switch when a signal is provided to the high side inverting amplifier to turn off the high side switch, wherein the semiconductor switch and series diode are formed as a unitary synchronous rectifier device.

12. An inverter phase leg comprising:

(a) a high supply line and a low supply line across which a DC voltage may be provided;

(b) a high side gate controlled switch connected to the high line and a low side gate controlled switch connected to the low line, the switches connected between the high line and the low line with an output node between the high side switch and the low side switch;

(c) a series diode connected between the output node and the low side switch that is oriented to a conduct current from the output node through the low side switch and to block current in the opposite direction;

(d) an electrical conductor providing a direct electrical connection without a resistive component from a junction between the series diode and the low side switch to the gate of the high side switch; and (e) wherein a gate signal can be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including a semiconductor switch connected in parallel with the series diode and having a gate input by which the semiconductor switch may be turned on and off, and a semiconductor switch driver amplifier connected to receive the low side switch gate signal as its input and having an output connected to the input of the high side driver amplifier, the semiconductor switch driver amplifier providing a non-inverting output that is electrically connected to the gate of the semiconductor switch so that the switch is turned on when a signal is provided to turn off the high side switch and is turned off when a signal is provided to turn on the high side switch.

13. An inverter phase leg comprising:

(a) a high supply line and a low supply line across which a DC voltage may be provided;

(b) a high side gate controlled switch connected to the high line and a low side gate controlled switch connected to the low line, the switches connected between the high line and the low line with an output node between the high side switch and the low side switch;

(c) a series diode connected between the output node and the low side switch that is oriented to a conduct current from the output node through the low side switch and to block current in the opposite direction;

(d) an electrical conductor providing a direct electrical connection without a resistive component from a junction between the series diode and the low side switch to the gate of the high side switch; and (e) wherein a gate signal can be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including a semiconductor switch connected in parallel with the series diode and having a gate input by which the semiconductor switch may be turned on and off, and a semiconductor switch driver amplifier connected to receive the low side switch gate signal as its input and having an output connected to the input of the high side driver amplifier, the semiconductor switch driver amplifier providing a non-inverting output that is electrically connected to the gate of the semiconductor switch so that the switch is turned on when a signal is provided to turn off the high side switch and is turned off when a signal is provided to turn on the high side switch, wherein the semiconductor switch and series diode are formed as a unitary synchronous rectifier device.

14. A DC to AC inverter comprising:

(a) a high DC supply line and a low DC supply line; and (b) two or more inverter phase legs connected across the high supply line and the low supply line, each inverter phase leg comprising:

(1) a high side gate controlled switch connected to the high line and a low side gate controlled switch connected to the low line, the switches connected between the high line and the low line with an output node between the high side switch and the low side switch;

(2) a series diode connected between the output node and the low side switch that is oriented to a conduct current from the output node through the low side switch and to block current in the opposite direction;

(3) an electrical conductor providing a direct electrical connection without a resistive component from a junction between the series diode and the low side switch to the gate of the high side switch; and (4) wherein a gate signal may be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including for each phase leg a semiconductor switch connected in parallel with the series diode and having a gate input by which the semiconductor switch may be turned on and off, and including a switch driver amplifier having an output connected to the gate of the semiconductor switch and an input connected to the input of the high side driver amplifier so that the switch driver amplifier provides an output signal to turn on the semiconductor switch when a signal is provided to the high side inverting amplifier to turn off the high side switch.

15. A DC to AC inverter comprising:
(a) a high DC supply line and a low DC supply line; and
(b) two or more inverter phase legs connected across the high supply line and the low supply line, each inverter phase leg comprising:
  (1) a high side gate controlled switch connected to the high line and a low side gate controlled switch connected to the low line, the switches connected between the high line and the low line with an output node between the high side switch and the low side switch;
  (2) a series diode connected between the output node and the low side switch that is oriented to a conduct current from the output node through the low side switch and to block current in the opposite direction;
  (3) an electrical conductor providing a direct electrical connection without a resistive component from a junction between the series diode and the low side switch to the gate of the high side switch; and
  (4) wherein a gate signal may be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including for each phase leg a semiconductor switch connected in parallel with the series diode and having a gate input by which the semiconductor switch may be turned on and off, and including a switch driver amplifier having an output connected to the gate of the semiconductor switch and an input connected to the input of the high side driver amplifier so that the switch driver amplifier provides an output signal to turn on the semiconductor switch when a signal is provided to the high side inverting amplifier to turn off the high side switch, wherein for each phase leg the semiconductor switch and series diode are formed as a unitary synchronous rectifier device.

16. An inverter phase leg comprising:
(a) a high supply line and a low supply line across which a DC voltage may be provided;
(b) a high side gate controlled switch connected to the high line and a low side gate controlled switch connected to the low line, the switches connected between the high line and the low line with an output node between the high side switch and the low side switch;
(c) a gate controlled connector switch connected between the output node and the low side switch; and
(d) an electrical conductor providing a direct electrical connection without a resistive component from a junction between the connector switch and the low side switch to the gate of the high side switch.

17. The inverter phase leg of claim 16 wherein the high side switch and the low side switch each comprise an IGBT, and including a flyback diode connected in parallel with the high side switch from the high supply line to the output node and a flyback diode connected in parallel with the low side switch from the output node to the low supply line.

18. The inverter phase leg of claim 16 wherein the high side switch and the low side switch each comprise a power MOSFET.

19. The inverter phase leg of claim 16 including a low side driver amplifier having an input that can receive a gate control signal and an output connected to the gate of the low side switch, and a high side inverting driver amplifier having an output connected through a resistance to the gate of the high side switch, the output of the low side driver amplifier connected to an input of the high side inverting amplifier, the high side inverting amplifier connected between a high side gate voltage supply line and a line connected to the output node and providing at its output either the high side gate voltage or the voltage at the output node, the connector switch connected to turn on when the high side switch turns off.

20. The inverter phase leg of claim 19 further including a connector switch driver amplifier having an output connected to the gate of the connector switch and an input connected to the input of the high side driver amplifier so that the connector switch driver amplifier provides an output signal to turn on the connector switch when a signal is provided to the high side inverting amplifier to turn off the high side switch.

21. The inverter phase leg of claim 19 wherein the connector switch comprises a unitary synchronous rectifier device having a switch and a parallel diode.

22. The inverter phase leg of claim 19 further including a connector switch driver amplifier connected to receive the output of the low side driver amplifier as its input and having an output connected to the input of the high side driver amplifier, the connector switch driver amplifier providing a non-inverting output that is electrically connected to the gate of the connector switch so that the connector switch is turned on when a signal is provided to turn off the high side switch and is turned off when a signal is provided to turn on the high side switch.

23. A DC to AC inverter comprising:
(a) a high DC supply line and a low DC supply line; and
(b) two or more inverter phase legs connected across the high supply line and the low supply line, each inverter phase leg comprising:
  (1) a high side gate controlled switch connected to the high line and a low side gate controlled switch connected to the low line, the switches connected between the high line and the low line with an output node between the high side switch and the low side switch;

(2) a series diode connected between the output node and the low side switch that is oriented to a conduct current from the output node through the low side switch and to block current in the opposite direction;

(3) an electrical conductor providing a direct electrical connection without a resistive component from a junction between the series diode and the low side switch to the gate of the high side switch; and (4) wherein a gate signal may be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including for each phase leg a semiconductor switch connected in parallel with the series diode and having a gate input by which the semiconductor switch may be turned on and off, and a semiconductor switch driver amplifier connected to receive the low side gate signal at its input and having an output connected to the input of the high side driver amplifier, the semiconductor switch driver amplifier providing a non-inverting output that is electrically connected to the gate of the semiconductor switch so that the switch is turned on when a signal is provided to turn off the high side switch and is turned off when a signal is provided to turn on the high side switch.

24. A DC to AC inverter comprising:

(a) a high DC supply line and a low DC supply line; and (b) two or more inverter phase legs connected across the high supply line and the low supply line, each inverter phase leg comprising:

(1) a high side gate controlled switch connected to the high line and a low side gate controlled switch connected to the low line, the switches connected between the high line and the low line with an output node between the high side switch and the low side switch;

(2) a series diode connected between the output node and the low side switch that is oriented to a conduct current from the output node through the low side switch and to block current in the opposite direction;

(3) an electrical conductor providing a direct electrical connection without a resistive component from a junction between the series diode and the low side switch to the gate of the high side switch; and (4) wherein a gate signal may be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including for each phase leg a semiconductor switch connected in parallel with the series diode and having a gate input by which the semiconductor switch may be turned on and off, and a semiconductor switch driver amplifier connected to receive the low side gate signal at its input and having an output connected to the input of the high side driver amplifier, the semiconductor switch driver amplifier providing a non-inverting output that is electrically connected to the gate of the semiconductor switch so that the switch is turned on when a signal is provided to turn off the high side switch and is turned off when a signal is provided to turn on the high side switch, wherein for each phase leg the semiconductor switch and series diode are formed as a unitary synchronous rectifier device.

25. A DC to AC inverter comprising:

(a) a high DC supply line and a low DC supply line; and (b) two or more inverter phase legs connected across the high supply line and the low supply line, each inverter phase leg comprising;

(1) a high side gate controlled switch connected to the high line and a low side gate controlled switch connected to the low line, the switches connected between the high line and the low line with an output node between the high side switch and the low side switch;

(2) a series diode connected between the output node and the low side switch that is oriented to a conduct current from the output node through the low side switch and to block current in the opposite direction;

(3) an electrical conductor providing a direct electrical connection without a resistive component from a junction between the series diode and the low side switch to the gate of the high side switch; and (4) wherein a gate signal may be provided to the gate of the low side switch, and a high side inverting driver amplifier having an output connected through a resistance to the gate of the high side switch, the low side gate signal provided through a diode to an input of the high side inverting amplifier, the high side inverting amplifier connected between a high side gate voltage supply line and a line connected to the output node and providing at its output either the high side gate voltage or the voltage at the output node; further including for each phase leg a semiconductor switch connected in parallel with the series diode and having a gate input by which the semiconductor switch may be turned on and off, and a semiconductor switch driver amplifier connected to receive the low side gate signal at its input and having an output connected to the input of the high side driver amplifier, the semiconductor switch driver amplifier providing a non-inverting output that is electrically connected to the gate of the semiconductor switch so that the switch is turned on when a signal is provided to turn off the high side switch and is turned off when a signal is provided to turn on the high side switch, wherein for each phase leg the series diode is a Schottky diode.

* * * * *